United States Patent [19]

Reinhardt et al.

[11] Patent Number: 4,937,536
[45] Date of Patent: Jun. 26, 1990

[54] FAST SETTLING PHASE LOCK LOOP

[75] Inventors: Victor S. Reinhardt, Rancho Palos Verdes; George S. Des Brisay, Jr., Hemet; Kim V. Gould, Hermosa Beach, all of Calif.

[73] Assignee: Hughes Aircraft Company, Los Angeles, Calif.

[21] Appl. No.: 233,798

[22] Filed: Aug. 19, 1988

[51] Int. Cl.$^5$ .............................................. H03L 7/00
[52] U.S. Cl. ......................................... 331/8; 331/17; 331/25
[58] Field of Search .......................... 331/8, 16, 17, 25; 328/72; 307/520

[56] References Cited

U.S. PATENT DOCUMENTS 4,752,749 6/1988 Moger .................................... 331/17

OTHER PUBLICATIONS

Josefsberg, Stable and Fast PLL Switches Loop Bandwidths, Electronics, vol. 55, No. 5, Mar. 10, 1982.

Primary Examiner—Robert J. Pascal
Attorney, Agent, or Firm—Steven M. Mitchell; Robert A. Westerlund; W. K. Denson-Low

[57] ABSTRACT

A phase lock loop frequency synthesizer for providing a synthesized frequency signal employing a modified adaptive loop construction having parallel feedback paths about a loop amplifier. A normal feedback path having a narrow bandwidth characteristic includes a feedback capacitor having one end connected to electrical ground via a controlled switch and a second feedback path having a wide bandwidth characteristic with a capacitor also connected across the amplifier. Upon the variation of an incoming reference signal, the controlled switch connects the normal feedback capacitor to ground permitting the wide bandwidth feedback path to rapidly settle the loop while charging the feedback capacitor of the normal feedback path. Upon opening the controlled switch, the narrow bandwidth feedback path completes the charging of the feedback capacitor of the normal feedback loop settling the loop to the steady state condition while enhancing the settling time.

38 Claims, 4 Drawing Sheets

FAST SETTLING PHASE LOCK LOOP

BACKGROUND OF THE INVENTION

The invention relates generally to frequency synthesizers and more particularly to a phase lock loop which, upon a change in a reference frequency, settles very quickly to a steady state condition while having a relatively narrow final loop bandwidth.

In the field of frequency synthesis, phase lock loops are employed to act as wide frequency range tracking filters and as wide frequency range frequency translators. When thus used, the phase lock loop is designed to lock a synthesized signal of a first oscillator at a first frequency and at a first phase to the phase of an incoming reference signal at another frequency. Once the frequency of the synthesized signal developed in the phase lock loop is matched to that of the incoming reference signal, steady state is said to exist. However, when the frequencies of the incoming reference signals vary from the synthesized signal, the phase lock loop experiences a transient state before the loop locks on and settles to the new incoming reference frequency. For many applications, it is important to reduce the time spent in this transient state so that this situation continues to be a problem with phase lock loop frequency synthesizers.

Generally, the loop is a modified servo system which includes a transducer mixer for receiving the reference signal and an output signal from the voltage-controlled oscillator of the phase lock loop. The transducer mixer produces an error signal which is fed to a high gain amplifier which incorporates negative feedback. As the error signal increases, a control voltage produced by the amplifier is adjusted to reduce the error signal. In the limit, the amplifier gain is very large and the error signal is driven to zero in an ideal servo system.

The output signal of the phase lock loop is a synthesized frequency which in effect is a new frequency that is developed from a combination of the reference frequencies and the frequencies developed within the phase lock loop. If the intent is to create a relatively high frequency, such as 750 MHz by way of example only, then the phase lock loop must be able to produce high frequencies but yet maintain the stability of the original source device. The source device may be a reference oscillator, such as a frequency-controlled crystal oscillator.

A frequency signal voltage v(t) is described mathematically by the following expression.

$$v(t) = A \sin(2\pi ft + \phi) \quad (1)$$

The term (A) is defined as the amplitude of the signal voltage while the term (f) is defined as the frequency of the signal voltage. The additional term ($\phi$) is defined as the phase angle of the signal voltage v(t). In the past, phase lock loop frequency synthesizers generated a synthesized frequency signal voltage. The frequency of the signal voltage was ($f_0$) and the phase angle was designated ($\phi_0$). The signal voltage was generated from reference signals having frequencies ($f_1, f_2, \ldots, f_n$) and having corresponding phase angles ($\phi_1, \phi_2, \ldots, \phi_n$). Thus, the frequency of the syntehsized signal voltage may be defined as $$f_0 = R_1 f_1 + R_2 f_2 + \ldots + R_n f_n \quad (2)$$

and the phase angle of the synthesized signal voltage may be defined as $$0 = R_1 \phi_1 + R_2 \phi_2 + \ldots + R_n \phi_n \quad (3)$$

where the terms ($R_1, R_2, \ldots, R_n$) are adjustable numbers.

Generally, a typical phase lock loop frequency synthesizer of the past includes a pair of the reference frequencies $f_1$, $f_2$ employed to generate the synthesized output frequency $f_0$ of the phase lock loop. The synthesizer typically would include a voltage controlled oscillator which provided the synthesized output frequency $f_0$. The output frequency $f_0$ is controlled by a voltage $v_o$ supplied to the oscillator and it is the voltage $v_o$ that causes the oscillator to provide the synthesized output frequency $f_0$. A frequency transducer mixer receives the reference frequency $f_2$ from a local oscillator and also receives the output frequency $f_0$ from the voltage controlled oscillator. The sum and difference of the two frequencies are delivered to a low pass filter that permits only the signal represented by the difference in frequencies to pass. Thus, the frequency ($f_0 - f_2$) is received by a programmable frequency divider and divided by a number (N) providing a signal having the frequency ($f_0 - f_2$)/N.

A phase detector is provided for receiving the signal having the frequency ($f_0 - f_2$)/N from the divider and the reference frequency $f_1$ from another local oscillator. The phase detector provides an output signal error voltage ($v_e$) which is proportional divider having frequency ($f_0 - f_2$)/N and the reference signal having frequency $f_1$. The output signal error voltage $v_e$ is then delivered to a loop filter which is comprised of an amplifier, a pair of resistors and a capacitor. The first resistor is an input resistor to the amplifier while the second resistor and the capacitor form a series feedback loop between the input and output of the amplifier. The loop filter operates upon the error voltage $v_e$ for providing the voltage $v_o$ which is the voltage controlled oscillator control voltage.

In operation, the typical phase lock loop frequency synthesizer of the past acts as a negative feedback servo loop which, in the steady state, drives the error voltage $v_e$ to zero by controlling the voltage controlled oscillator frequency. For the error voltage $v_e$ to be equivalent to zero, both the phases and frequencies of the signal ($f_0 - f_2$)/N and the reference signal $f_1$ transmitted to the phase detector must be equal. When these two signals are equivalent in phase angle and frequency, the frequency of the synthesized signal voltage provided by the voltage controlled oscillator becomes $$f_0 = N f_1 + f_2 \quad (4)$$

and the phase angle of the voltage controlled oscillator becomes $$\phi_0 = N \phi_1 + \phi_2. \quad (5)$$

Note that although the divide-by-N circuit is employed in the phase lock loop, a multiply-by-N circuit results. This is a significant feature since generally phase lock loop frequency synthesizers invert the operations performed on the voltage controlled oscillator frequency $f_0$.

Another useful function of the phase lock loop of the prior art is that of narrowing the bandwidth. If the phase of the incoming reference signal is varied, the phase lock loop will track the phase variation only inside the loop bandwidth and thus the properties of the voltage-controlled oscillator must be relied upon. Additionally, if the phase of the reference signal is stable but includes electrical noise riding thereon, the phase lock loop will track the reference signal inside the loop bandwidth and will clip extraneous noise extending beyond the bandwidth. Thus, the result is that the phase lock loop eliminates some of the electrical noise and transient spurs outside the loop bandwidth. This characteristic is useful in a synthesizer incorporated within a communications network so that a reference frequency may be broadcast providing a transmitter signal which is essentially free of electrical noise. Thus, the loop acts as a tracking filter following the reference frequency even if the reference frequency changes.

When the reference frequency changes, the synthesized frequency developed by the voltage-controlled oscillator must also change to correspond to the change in the reference frequency. This change results in a settling time within the phase lock loop to permit the circuit to reach the steady state condition. Thus, a basic problem with the phase lock loops of the prior art is that although the bandwidth of the phase lock loop is narrower which permits eliminating electrical noise from the synthesized signal, the loop takes longer to settle to the final steady state value. The challenge is to design a phase lock loop synthesizer which includes the property of a short settling time given a narrow loop bandwidth. This relationship is clearly depicted by Equation (6) which illustrates that the settling time is proportional to the reciprocal of the bandwidth.

$$\tau \alpha 1/Bw \qquad (6)$$

It can be seen from this relationship that the narrower the bandwidth, then the larger the fraction 1/Bw becomes, resulting in a longer settling time in seconds. Thus, when a change occurs in the reference frequency, the time it takes for the phase lock loop to settle out and stablize into the steady state mode is controlled in part by the bandwidth.

The challenge to those skilled in the art has been to build a synthesizer that is capable of a fast settling time once the reference frequency has been changed while simultaneously having a narrow bandwidth. An example of a system which could effectively employ a phase lock loop with such characteristics is a frequency hopping system which is employed to change the frequency for encoding transmission having a fast settling time and a narrow bandwidth. Such a circuit is useful in communications system which utilize frequency hopping.

In an effort to reduce the loop settling time, phase lock loops in frequency synthesizers have previously comprised precharge and pretune circuits, very complex multiple loop configurations, and ping-pong synthesizers. The settling time reduction available from pretune and precharge circuits is limited by the accuracy resolutions of a digital-to-analog converter used in these circuits and by the uncertainty in knowing the proper control voltage of the voltage-controlled oscillator. There have been fast settling loops in the prior art, but these fast settling loops have consisted of very complex circuits with substantially higher manufacturing costs, weights, and power consumptions. Ping-pong synthesizers achieve fast settling times by switching between two relatively slow phase lock loop synthesizers.

The phase lock loop of the prior art included the amplifier which incorporated the negative feedback network having the capacitor connected therein. The time necessary to charge and discharge the capacitor was the principle limitation on the settling time for the loop. Also, the charging rate of the capacitor in normal loop operations was directly proportional to the loop bandwidth. The pretuned circuit was designed to reduce the required change in capacitor voltage.

If the voltage output of the voltage-controlled amplifier was made the sum of the amplifier voltage and a pretuned digital-to-analog converter voltage, the approximate value of the oscillator output voltage at the new reference frequency could be loaded into the digital-to-analog converter when the synthesizer frequency was changed. Under these conditions, the capacitor only had to be charged an amount to account for the uncertainty in knowing the true value of the oscillator output voltage. The settling time was reduced, but the reduction depended upon the accuracy and resolution of the digital-to-analog converter and the uncertainty in knowing the tuning curve of the voltage-controlled oscillator.

Another method included precharging the feedback capacitor to a value approximating its new value. A precharge circuit was temporarily connected to the feedback capacitor to charge it quickly when the reference frequency was changed. The reduction in the settling time again depended on how close the voltage across the feedback capacitor was brought to the required value.

If the precharge circuit was perfect, the settling time could be reduced to the point where the feedback capacitor could be charged instantly. However, the charge required on the feedback capacitor to settle the loop to steady state initially can only be estimated. The proper value of the output voltage of the voltage-controlled oscillator must be known to produce the correct oscillator output frequency signal. Without this information, the proper charge required on the feedback capacitor when the reference signal varies can only be estimated. Likewise, the output of the pretune circuit can only approximate the proper voltage and frequency output of the voltage-controlled oscillator.

In the pretune circuit, a voltage from the digital-to-analog converter is permanently added to the voltage output of the amplifier and that sum is fed to the voltage-controlled oscillator. The value of the pretuned permanent voltage is dependent upon the estimated value of the output voltage of the voltage-controlled oscillator.

Thus, a problem that exists in the pretune circuit is that any electrical noise or distortion riding on the permanently applied pretuned voltage adds electrical noise to the input of the voltage-controlled oscillator. Therefore, if the pretuned voltage varies, then the controlled voltage tracking the variation in the reference voltage of the incoming signal also varies. However, this variation in the controlled voltage does not reflect a variation in the reference voltage. Note that the precharge circuit depends upon the relation between the charge on the capacitor and the voltage across the capacitor, as is illustrated in Equation (7).

$$V = Q/C \qquad (7)$$

If the charge on the capacitor could be changed instantly, the voltage across the capacitor and thus the voltage output of the amplifier could also be changed instantly, substantially reducing the settling time even further. Unlike the pretune circuit, the precharge circuit is disconnected after the feedback capacitor is charged and does not add additional electrical noise. However, this circuit is complicated. The basic disadvantage remains in that the relationship between the voltage output and the frequency output of the voltage-controlled oscillator is only approximately known.

A further modification to the phase lock loop includes the adaptive loop which changes the loop bandwidth as the loop settles. The amplifier includes two feedback paths, each path including a capacitor with a switch. The two paths are in parallel and the feedback path connected at any particular time depends upon the switch which is closed. A first feedback path provides a broad bandwidth loop having a fast settling time while the second feedback path provides a narrow bandwidth loop having a slower settling time.

After a variation in the reference voltage, the first switch connects the broad bandwidth feedback path across the amplifier providing a fast settling time. In order to reduce the amount of electrical noise and spurs, the first switch is opened and the second switch is closed connecting the narrow bandwidth feedback path across the loop amplifier providing a slower settling time.

The narrow bandwidth feedback path increases the spectral purity and reduces the electrical noise. At the time the second switch is operated, the second feedback capacitor is not charged. Thus, the amplifier output voltage is forced to zero and the precharge circuit puts an initial charge across the second feedback capacitor. However, as with previous circuits, the charge applied to the feedback capacitor by the precharge circuit is only an estimate as to what is required.

It is obvious from the above that those concerned with the development and use of fast settling phase lock loops have long recognized the need for improved phase lock loops which enable the loop to settle in a rapid manner while employing a final narrow loop bandwidth. The present invention fulfills all of these needs.

SUMMARY OF THE INVENTION

Briefly, and in general terms, the present invention provides a new and improved phase lock loop frequency synthesizer embodying novel methods and apparatus for accurately and reliably reducing the settling time of a phase lock loop after a variation in the reference frequency occurs by employing a modified adaptive loop construction incorporating a switch in the narrow bandwidth feedback loop which when open-circuited permits the loop to settle at a fast rate charging the capacitor in the narrow feedback path to accommodate for the change in the reference frequency and reducing the settling time.

Basically, the present invention is directed to an improved phase lock loop frequency synthesizer for providing a synthesized frequency signal which includes parallel feedback paths about an amplifier. A normal feedback loop includes a charging capacitor having one end connected to electrical ground by way of a switch and a second wide loop bandwidth feedback network also connected across the amplifier. When the reference frequency is varied, the switch is closed, short-circuiting the normal feedback path so that the loop bandwidth is now determined by the wide loop bandwidth feedback network.

The loop initially settles at a very fast rate after a pretune or precharge circuit is invoked. The feedback capacitor of the normal feedback loop is now connected across the output of the amplifier and is rapidly charged to the correct value as the wide band loop settles.

After the wide band loop approaches the steady state condition, the switch is opened and the normal feedback path is re-established. The normal feedback path is a narrow bandwidth loop which includes the feedback capacitor which is almost completely charged. The narrow bandwidth feedback loop need only account for the increased electrical noise in the wide band loop to completely charge the normal feedback capacitor, causing the phase lock loop to settle to account for the original variation in the reference frequency.

The new and improved phase lock loop frequency synthesizer of the present invention achieves a fast settling time while having a narrow final loop bandwidth for reducing the electrical noise and spurious operations and for increasing spectral purity of the synthesized signal. Since additional circuitry incorporated in the prior art may be eliminated, a substantially lower weight and lower power consumption is achieved and consequently substantially lower manufacturing costs are experienced for existing satellite programs.

These and other objects and advantages of the invention will become apparent from the following more detailed description, when taken in conjunction with the accompanying drawings of illustrative embodiments.

DETAILED DESCRIPTION OF THE PREFERRED EMBODIMENT

As shown in the drawings for purposes of illustration, the invention is embodied in a phase lock loop frequency synthesizer 20 of the type having a voltage-controlled oscillator 22 which receives an output signal from an amplifier 24 and includes an adaptive feedback loop design in combination with a switching device connected to electrical ground for enhancing the settling time.

Figure 1:
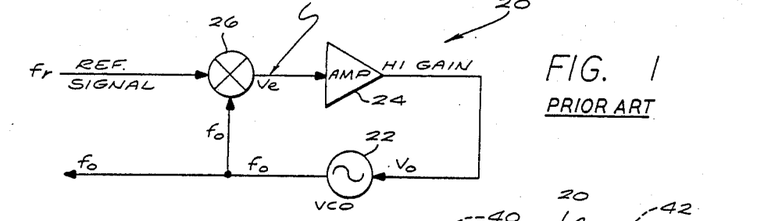
FIG. 1 is a circuit diagram of a basic servo system of the prior art.

Generally, the phase lock loop 20 is a servo system which includes a transducer mixer 26 which receives a reference signal having a frequency ($f_r$) and a voltage ($v_r$) and an output signal ($f_o$) from the voltage-controlled oscillator 22, as is illustrated in FIG. 1. The output of the mixer 26 is a voltage error signal designated $v_e$ having a frequency which is equal to:

$$f_e = f_r - f_o \tag{8}$$

The error signal which includes the difference between the two input signals to the mixer 26 is then fed to the amplifier 24 which provides the amplifier output signal $v_o$ that is fed to the oscillator 22. The output frequency $f_o$ of the oscillator 22 is controlled by the voltage input $v_o$. The frequency signal $f_o$ is fed to an output terminal and is also fed back into the mixer 26 as part of a feedback loop. If the error signal increases, the amplifier 24 amplifies the error signal and feeds it back to the mixer through the oscillator 22 for subtraction from the voltage reference signal being received. In the limit, the difference between the voltage reference signal $v_r$ and the oscillator output signal having the frequency $f_o$ is minimized in the ideal servo system.

Figure 2:
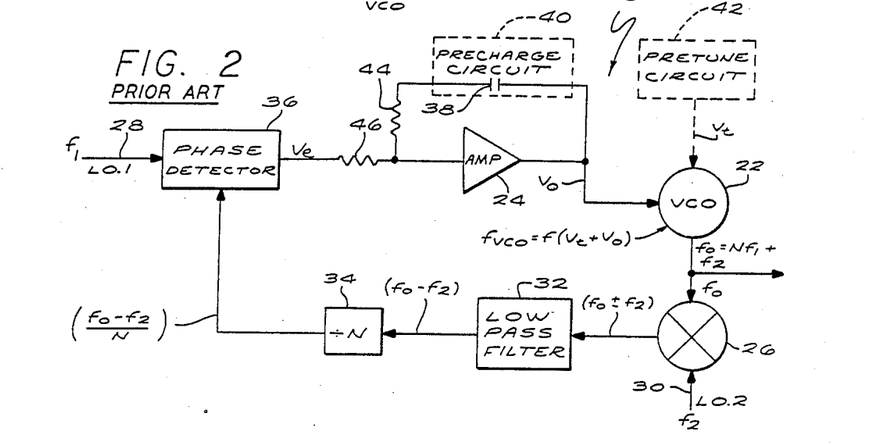
FIG. 2 is a circuit diagram of a typical frequency synthesizer of the prior art using a second order phase lock loop.

Further refinements in phase lock loop systems used in various frequency synthesis applications are illustrated in FIG. 2. The ability of the phase lock loop 20 to act as a wide frequency range tracking filter and as a wide range frequency translator make it valuable in signal processing and synthesizer applications. A typical frequency synthesizer using a second order phase lock loop includes the low noise voltage-controlled oscillator 22 which is phase locked to a first local oscillator 28 and a second local oscillator 30. The mixer 26 of the loop 20 determines the difference between the output frequency $f_o$ of the oscillator 22 and the output frequency $f_2$ of the second local oscillator 30. This difference is passed through a low pass filter 32 and divided by "N" in a divider 34.

The output of the divider 34 is phase compared in a detector 36 with the input reference frequency $f_1$ from the first local oscillator 28. The output of the phase detector 36 is the error signal $v_e$ having the frequency ($f_e$) which is employed to lock the phase lock loop 20 as is illustrated in Equation (9).

$$f_e = (f_1) - \frac{(f_o - f_2)}{N} \tag{9}$$

By setting the error signal equal to zero in Equation (9) and applying simple mathematical operations, the equation may be solved for the term $f_o$ by transposition. The result is that the output signal of the oscillator 22 is dependent upon the output signals of the first local oscillator 28 and the second local oscillator 30 as is illustrated in Equation (4).

$$f_o = Nf_1 + f_2 \tag{4}$$

If the oscillator 22 experiences less electrical noise than the first local oscillator 28 or the second local oscillator 30, the phase lock loop synthesizer will produce a lower noise signal output as the loop bandwidth is narrowed. However, the negative aspect of this narrowing of the loop bandwidth has been that the phase lock loop 20 takes longer in time to settle to a new frequency when the reference signals $f_1$, $f_2$ are changed. Therefore, this invention addresses the long-felt need of achieving small settling times given a narrow loop bandwidth.

To understand how a fast settling time is achieved, consider the operation of the phase lock loop 20 when either of the signals $f_1$, $f_2$ are changed. When the second order phase lock loop is settled into the steady state, the output error voltage $v_e$ of the phase detector 36 is approximately zero because except for the electrical noise effects, a phase error between the oscillator output frequency $f_o$ and the combination of the frequencies $f_1$ and $f_2$ does not exist (see Equation 4). During the steady state, the output voltage $v_o$ of the amplifier 24 which controls the oscillator 22, is at the proper level to bring the oscillator 22 to the correct frequency $f_o$. This design requires that the output voltage $v_o$ appear across a feedback capacitor 38 of a precharge circuit 40.

When either of the reference frequencies $f_1$ or $f_2$ are changed, amplifier output voltage $v_o$ must be redetermined and the charge across the feedback capacitor 38 must be altered so that the new value of $v_o$ appears thereacross. The time in seconds that it takes to charge or discharge the feedback capacitor 38 is the principle limit on the settling time for the loop. The charging rate of the capacitor 38 in normal loop operations is directly proportional to the loop bandwidth.

Figure 3:
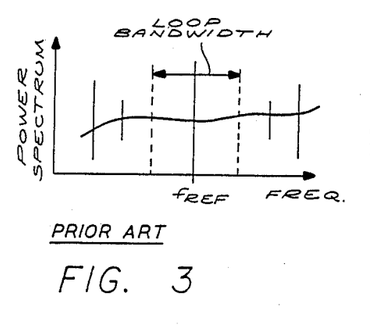
FIG. 3 is a graph illustrating power spectrum versus frequency and the loop bandwidth of the frequency synthesizer of FIG. 2.
Figure 4:
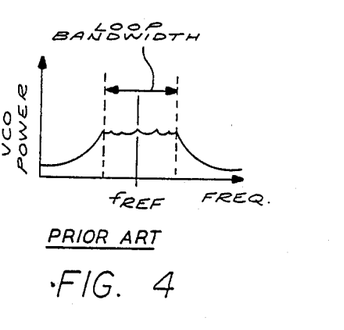
FIG. 4 is a graph illustrating the oscillator power versus frequency and the loop bandwidth for the frequency synthesizer of FIG. 2.

The characteristic of the loop bandwidth of the phase lock loop 20 of FIG. 2 is that if the reference phase ($\phi_r$) is varied, the phase lock loop will track the variation in the phase can be only inside the loop bandwidth relying on the properties of the oscillator 22. The reference phase can be stable but still contain substantial electrical noise. For this condition, the power spectrum versus frequency graph illustrating the loop bandwidth centered about the reference frequency is shown in FIG. 3. Further, the graph illustrating the oscillator power versus frequency of the prior art phase lock loop 20 is illustrated in FIG. 4. Note that the phase lock loop eliminates much of the electrical noise and spurious spikes outside of the loop bandwidth.

The precharge circuit 40 and a pretune circuit 42 are each connected to the phase lock loop in FIG. 2. In pretuning, the oscillator output voltage is made the sum of the amplifier output voltage $v_o$ and a pretune digital-to-analog converter voltage ($v_t$). If the approximate value of the oscillator output voltage at the new frequency is loaded into the digital-to-analog converter when the synthesizer frequency is changed, then the capacitor 38 only has to be charged to account for the uncertainty in knowing the true value of the oscillator output voltage. As the loop settles, a particular value of $v_o$ from the amplifier 24 is delivered to the oscillator 22 providing a certain output frequency $f_o$ from the oscillator.

Figure 5:
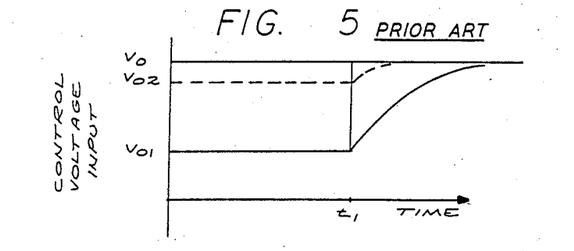
FIG. 5 is a graph of the control voltage input versus time for the synthesizer circuit of FIG. 2.

Although the characteristic curve as shown in FIG. 5 is known and the settling time is reduced, the improvement depends upon the accuracy and the resolution of the digital-to-analog converter and the uncertainty in knowing the tuning curve of the oscillator 22. The range of the control voltage input from $v_{o1}$ to $v_{o2}$ shown in FIG. 5 is only an estimate of the control voltage from the amplifier 24. The actual settling time is shown by that portion of the curve $v_{o1}$ at time $t_1$. However, the starting point of the control voltage using the pretune circuit is along curve $v_{o2}$ at time $t_1$ providing a definite advantage.

Figure 6:
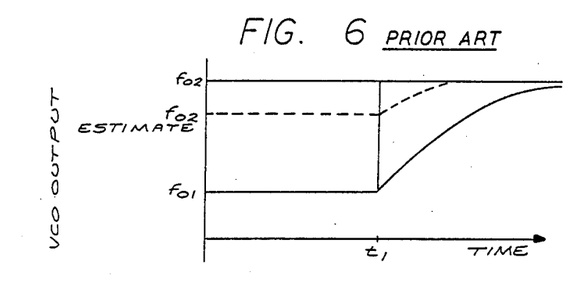
FIG. 6 is a graph illustrating the oscillator output versus time for the frequency synthesizer of FIG. 2.

The precharge circuit 40 is temporarily connected across the feedback capacitor 38 to charge the capacitor quickly when the reference frequencies $f_1$ or $f_2$ are changed. The characteristic curve for the oscillator output versus time illustrating the frequency curves is shown in FIG. 6. The actual settling time for the pretune or the precharge circuit is shown beginning along the curve $f_{o1}$ at time $t_1$. However, by employing either the pretune or precharge circuits, the enhanced settling time is shown along curve $f_{o2}$ beginning at point $t_1$. The incoming reference frequencies to be tracked have a frequency range which extends from $f_{o1}$ to $f_{o2}$ and the amplifier output voltage $v_o$ extends from a range of $v_{o1}$ to $v_{o2}$.

A certain time is required to provide the final output frequency $f_o$ from the voltage-controlled oscillator 22. As a practical matter, the value of N in the divider 34 is usually changed to force the voltage of the loop to change. This action controls the output of the oscillator to provide a change in the frequency $f_o$ and thus the pretune or precharge circuits provide a reduction in the settling time. The precharge circuit also includes a plurality of resistors 44 and 46 in combination with the feedback capacitor 38 for providing the proper RC time constant.

Figures 7, 8A, 8B:
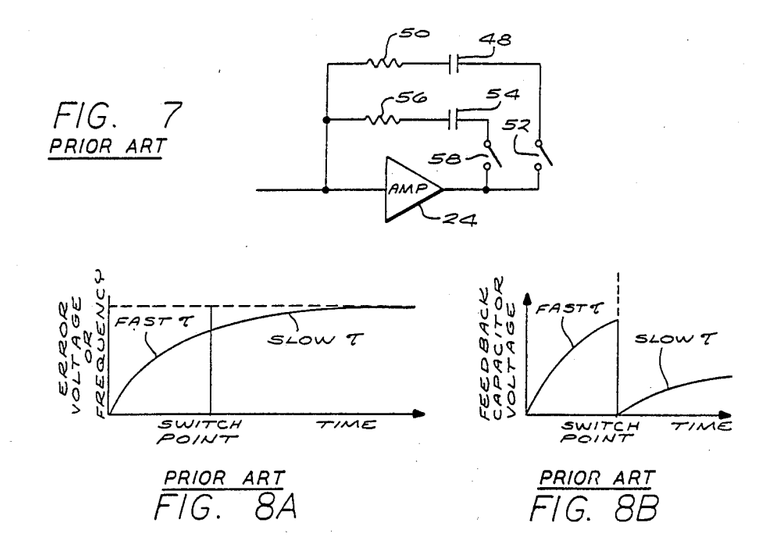
FIG. 7 is a schematic diagram of an adaptive loop circuit for a phase lock loop of the prior art.
FIG. 8A is a diagram of the error voltage or frequency versus time of the circuit illustrated in FIG. 7.
FIG. 8B is a graph of feedback capacitor voltage versus time at the switching point for the circuit illustrated in FIG. 7.

A circuit illustrating the adaptive loop concept of the prior art is illustrated in FIG. 7. Only the amplifier 24 with a pair of feedback loops is shown. The first feedback loop is designed for a broad bandwidth fast settling time application and includes a feedback capacitor 48 and a corresponding resistor 50. A switch 52 connects the first feedback loop to the output of the amplifier 24. The second feedback loop is designed for a narrow bandwidth slow settling time application and includes a feedback capacitor 54 and a corresponding resistor 56. The second feedback loop is connected to the output of the amplifier 24 by way of a switch 58.

Prior to the adaptive loop design, when a change in the reference frequency occurred, the settling time of the loop to steady state was long. The voltage output of the amplifier 24 was zero, since the charge on the feedback capacitor 54 was zero, as indicated in Equation (7). The oscillator output frequency $f_o$ depended upon the amplifier output voltage $v_o$ fed to the oscillator 22. If only the second feedback loop employing capacitor 54 was utilized, the loop settled slowly taking several milliseconds.

If the capacitor 54 were precharged before the loop was transferred from the fast settling state to the slow settling state, the settling time would be reduced to microseconds. However, when the feedback capacitor 54 is not charged to the particular value necessary prior to the switching to the slow settling state, then the voltage across the feedback capacitor drops and the circuit settling time is again lengthened as if the fast settling loop did not exist. Thus, charging the feedback capacitor prior to switching from the fast settling state to the slow settling state is necessary to avoid the dip in capacitor voltage.

Now upon the variation of the incoming reference signal, the first feedback loop is switched into the circuit providing a broad bandwidth. This configuration results in a small value of settling time ($\tau$) which is proportional to the reciprocal of the bandwidth as illustrated in Equation (6). Consequently, the feedback capacitor 48 of the first feedback loop is small compared to the size of the capacitor 54 of the second feedback loop. The smaller value of the capacitor 48 has a faster rise time resulting in a shorter charging period and a faster settling time. The graph of error voltage or frequency versus time is illustrated in FIG. 8A with the switch point being located on the graph to indicate the charging time of the respective capacitors 48 and 54.

The faster rise time on the left side of the switch point is indicative of the quick charging rate of capacitor 48. However, the slower rise time results in a longer settling time shown to the right of the switch point indicating the slower charging rate of capacitor 54. At the switch point, switch 52 is opened while switch 58 is closed connecting the second feedback loop. The second feedback loop has a narrow bandwidth characteristic so that the value of ($\tau$) is large as shown in Equation (6). The charging period for the capacitor 54 is much longer because of the slower rise time which leads to a longer settling time.

The basic disadvantage still exists in that the relationship between the voltage $v_o$ of the loop and the frequency output $f_o$ is only an approximation. Therefore, only an approximate value of the oscillator output voltage at the new frequency may be employed in the pretune circuit and only an approximate charge level can be provided to the feedback capacitor in the precharge circuit 40. Without the exact value of the oscillator output voltage, only an approximate value can be loaded into the pretune circuit and the proper charge for the feedback capacitor can only be estimated.

If the feedback capacitor is not charged to the particular value necessary prior to the switching to the second feedback loop, then the voltage across the feedback capacitor of the second feedback loop drops and the circuit settling time is again lengthened as if the fast settling loop did not exist. Thus, charging the second feedback capacitor 54 prior to switching from a fast to a slow settling time is important.

An illustration of the feedback capacitor voltage dropping to zero at the switching point from the fast settling time to the slow settling time is illustrated in FIG. 8B. After the switching point, it is noted that the second feedback loop provides a slow settling time, eliminating any benefit of the first feedback loop. The problem is clearly illustrated by the Equation (7) in which the voltage across the capacitor is equal to the charge across the capacitor divided by the capacitance. If the charge across the capacitor dissipates to zero then the voltage across the capacitor becomes zero.

Figure 9:
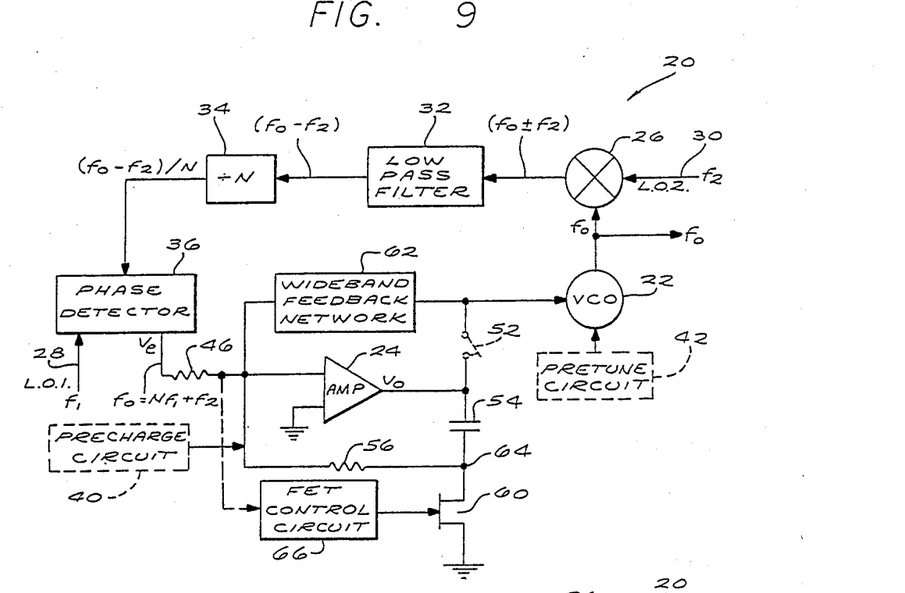
FIG. 9 is a circuit diagram of a fast settling phase lock loop in accordance with the present invention.

In accordance with the present invention, the adaptive loop construction in combination with an electronic switch 60 cooperate to enhance the settling time of the phase lock loop 20 and to significantly increase the charge across the capacitor 54 of the second feedback loop at the time the electronic switch 60 is operated converting the phase lock loop from a broad bandwidth, fast settling time constant circuit to a narrow bandwidth, slow settling time constant circuit. Further, the phase lock loop 20 achieves a fast settling time while having a narrow final loop bandwidth for reducing the electrical noise and spurious operations and for increasing spectral purity of the synthesized signal. Additionally, a substantially lower weight and lower power consumption is achieved by the elimination of circuitry and consequently substantially lower manufacturing costs are experienced.

The settling time reduction available with both pretune and precharge circuits is limited by the uncertainty in knowing and producing the required value of oscillator output voltage. Employing a two-stage charging loop adds to the conventional amplifier 24, the electronic switch 60 which connects one terminal of the feedback capacitor 54 to electrical ground and also adds a second wide loop bandwidth feedback network 62.

The feedback network 62 is of the wide bandwidth, fast settling type which may be an RC or other time constant type and which may be a first order or second order feedback network. Generally, when the frequency is changed, the electronic switch 60 is closed short circuiting the normally connected second feedback loop of resistor 56 and feedback capacitor 54. Resistor 56 is eliminated from the circuitry and the loop bandwidth is now determined by the wide loop bandwidth feedback network 62. Under these conditions, the loop 20 settles at a very fast rate after the pretune circuit 42 or the precharge circuit 40 is invoked.

Because the capacitor 54 is now across the output of the amplifier and not part of the loop feedback network, it is charged to the correct value of the amplifier output $v_o$ as the wide band loop settles following a variation in the reference signals $f_1$, $f_2$. The rate at which the capacitor 54 can be charged in this mode is limited only by the output impedance and slewing rate of the amplifier 24 and the phase detector sampling rate determined by reference signal $f_1$, so that the bandwidth of the wide band loop can be made quite large as compared with the final bandwidth.

The wideband feedback network 62 is shown in a parallel connection across the amplifier 24. The switch 52 may be any one of a plurality of electrical, electronic, optical, or any other suitable switching means available. The feedback network 62 may be comprised of any suitable combination of feedback elements, such as a first order loop comprised of a resistance only, a second order loop comprised of an RC combination or a third order loop comprised of a more complicated circuit. In the second feedback loop, feedback capacitor 54 is connected with resistor 56 in parallel with the feedback network 62 across the amplifier 24. The electronic switch 60 is connected to terminal 64 of the feedback capacitor 54. Electronic switch 60 is shown, for illustrative purposes only, as a field effect transistor with the source terminal connected to the terminal 64 and the drain terminal connected to electrical ground. The gate terminal of the transistor 60 is connected directly to a control circuit 66. The transistor switch 60 is employed to switch between the broad bandwidth, fast settling state and the narrow bandwidth, slow settling state and to charge the feedback capacitor 54 in the fast settling state.

The oscillator 22 provides a voltage-controlled frequency source, while the wide band feedback network 62 provides filtering to set the wide loop bandwidth which controls the settling time and the charging rate of capacitor 54. The amplifier 24 serves to amplify the error signal $v_e$ and to provide negative feedback for reducing the error. The second feedback network creates a second order feedback loop which provides filtering to set the loop feedback bandwidth as shown in FIG. 9.

The mixer 26, the low pass filter 32, and the divider circuit 34 comprise a particular embodiment forming a frequency translation network for illustration purposes only. The mixer 26 receives the reference signal $f_2$ and the oscillator output signal $f_o$ and provides at the output of the mixer 26 the sum and the difference of the two reference signals. By design, the low pass filter 32 eliminates the sum of the reference frequency $f_2$ and the oscillator output signal $f_o$ leaving only the difference of the signals to be utilized by the frequency translation network and the feedback loop. The divider circuit divides the difference of the oscillator output signal $f_o$ minus the reference signal $f_2$ by N which is a practical means of calibrating the frequency translation network.

The phase detector 36 compares the reference frequency $f_1$ with the difference in the frequencies ($f_o - f_2$) divided by the quantity N and provides a voltage output proportional to the difference in phase of the two input frequencies. The voltage output signal is the error signal which is fed to the amplifier 24. In the divider 34, the numerical value of "N" is adjustable to produce the desired frequency. In the phase detector 36, a comparison is completed such that the oscillator output frequency $f_o$ is calculated according to Equation (4). The value $f_o$ equals the output frequency of the synthesizer which may be altered by adjusting the reference frequencies $f_1$, $f_2$ or by varying the value of N of the divider 34. The phase lock loop 20 synthesizes or creates a separate frequency from the frequencies that were initially employed.

Figure 10:
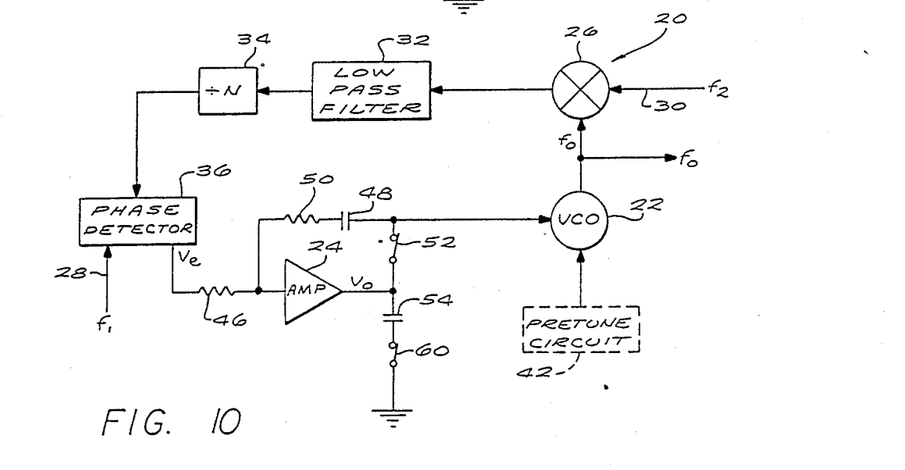
FIG. 10 is a schematic diagram of the fast settling state of the phase lock loop illustrated in FIG. 9.

The switch 52 and the electronic switch 60 are each opened during the slow settling time in which the phase lock loop has a characteristically narrow bandwidth and capacitor 54 and resistor 56 control the RC time constant of the loop. In the fast settling state, both the switch 52 and the electronic switch 60 are closed and the resistor 56 is eliminated from the circuitry as is the precharge circuit 40. Such a condition is illustrated in FIG. 10 which is the posture of the circuit during the fast settling state. The time constant of the circuit of FIG. 10 is the multiple of resistor 50 and capacitor 48 which describes the settling time ($\tau$) which is proportional to the reciprocal of the bandwidth. Under these conditions, a broad bandwidth feedback loop is created because the narrow bandwidth created by the second feedback loop was eliminated by connecting capacitor 54 to ground.

With resistor 56 eliminated from the circuitry, there is not an RC time constant associated with feedback capacitor 54. If the amplifier 24 has a low internal resistance, the capacitor 54 can be charged in a rapid manner, since resistor 56 is not limiting the charging current. Although the settling time is determined by the RC combination of the wide band feedback network 62, capacitor 54 is charging to the proper value. If capacitor 54 failed to charge to the proper value as in the prior art circuitry, the voltage across capacitor 54 would drop after switching from the fast settling state to the slow setting state resulting in a longer settling time.

Figure 11:
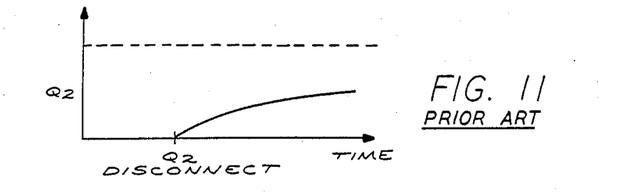
FIG. 11 is a diagram illustrating the charge on a feedback capacitor of the prior art at the switching point.

The longer settling time caused by an inadequate voltage across feedback capacitor 54 is illustrated in the graph of FIG. 11. The switching point from the fast settling state to the slow settling state is designated as the point $Q_2$ which is indicative of the charge across the capacitor 54 at the time of switch-over. After switching to the slow settling state, if the voltage across capacitor 54 is inadequate (as if resistor 56 were still in the circuit) the charging of the feedback capacitor would be much slower extending the settling time as shown in FIG. 11.

Figure 12:
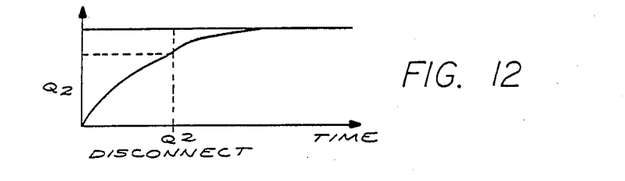
FIG. 12 is a diagram of the charge on the feedback capacitor at the switching point for the circuit illustrated in FIG. 9.

In comparison with the present invention, the charge on the feedback capacitor 54 at the time of switch-over from the fast settling state to the slow settling state is much higher, as shown in FIG. 12. The charge on the feedback capacitor is sufficiently high so that after the switch-over at point $Q_2$, the voltage across the feedback capacitor does not drop to zero. This improvement provides the full benefit of the precharge circuit 40 and the pretune circuit 42. Thus the feedback capacitor 54 of the final narrow band phase lock loop 20 is charged to its proper steady state value while reducing electrical noise and spurious operation. In addition to enhancing the settling time of the loop, this design substantially lowers the overall weight and power consumption of prior designs. A major advantage is that the phase lock loop achieves the steady state condition much faster.

During the fast settling state when the time constant is controlled by the wide band feedback network 62, the feedback capacitor 54 is charged by the amplifier 24 so that when the circuit is switched to the slow settling condition, the voltage across the input of the oscillator 22 is not equal to zero and the feedback capacitor is approximately charged to the proper value. The accumulation of electrical noise prevents completely settling the loop in the fast settling state because the electrical noise causes error when the electrical switching occurs. The fast switching settles to a level determined by the noise in the wide band feedback network 62.

The optimum condition that could exist would be that the actual settling time of the phase lock loop 20 be a function of the fast settling time. However, the trade-off between the increase in settling time in the fast settling state and the increase in the noise level caused by the elements in the fast settling loop limits such a solution.

After waiting an appropriate time for the wide band loop to settle, the control circuit 66 opens the electronic switch 60. At that point, settling of the narrow band loop only has to account for the increased noise in the wide band loop. The control circuit 66 controls the operation of the electronic switch 60 by monitoring the error voltage. The error voltage indicates a change in the incoming reference signal which requires a change in the settling time of the synthesized signal needed to reach steady state. The error voltage is referred to as the "loop stress" and while the circuit is in steady state, the loop stress is equal to zero. During the settling time, the error voltage is a convenient way to moderate or measure whether the loop has settled.

An alternate way that the control circuit 66 controls the switching of the electronic switch 60 is to wait an appropriate amount of time until the feedback capacitor 54 charges. This can be accomplished by installing an electronic or logical timer on the control circuit. After the command is received by the control circuit 66 from an external circuit (not shown) that a change in the reference frequency ($f_1$, $f_2$) has occurred, the electronic switch 60 will be operated. An example of this type of application is a frequency hopping synthesizer which changes the reference frequencies $f_1$, $f_2$ by an appropriate control device. The switching time is dependent upon the bandwidth of the loop.

In the slow settling state, both switch 52 and electronic switch 60 are open, which restores resistor 56 to the circuit of the second feedback loop. The second feedback loop controls the time constant, resulting in a narrow bandwidth and a slower settling time. At this point, the charge on the feedback capacitor 54 is correct and all the advantages of a slow time constant are enjoyed which include a narrower bandwidth providing reduced electrical noise and increased spectral purity. The voltage across the feedback capacitor does not dip to zero and the settling time is enhanced.

It should be noted that when the circuit is switched from the fast settling state to the slow settling state, switch 52 may be left in the closed position since the narrow bandwidth characteristic dominates the wide band network. Thus, after the electronic switch 60 is open-circuited by the control circuit 66, the combination of the feedback capacitor 54 and the resistor 56 will dominate the settling time characteristic of the phase lock loop 20 notwithstanding that the wide band feedback network 62 is still connected. Ten-to-twenty time constants are typically required for settling a loop to the proper value of phase or frequency. Typically, a slow settling time requires approximately twenty-five time constants while a fast settling time requires from five-to-ten time constants to settle the loop.

Since the root mean square (RMS) phase noise introduced by the phase lock loop 20 is only proportional to the square root of the loop bandwidth, the narrow band loop will not have to settle very far. If the wide band loop is ten times the bandwidth of the narrow band loop, the initial phase error in the final loop configuration will be only approximately three times the final noise level. This also means that the lower the noise level of the loop, the faster the loop will settle to a given phase value.

Figure 13:
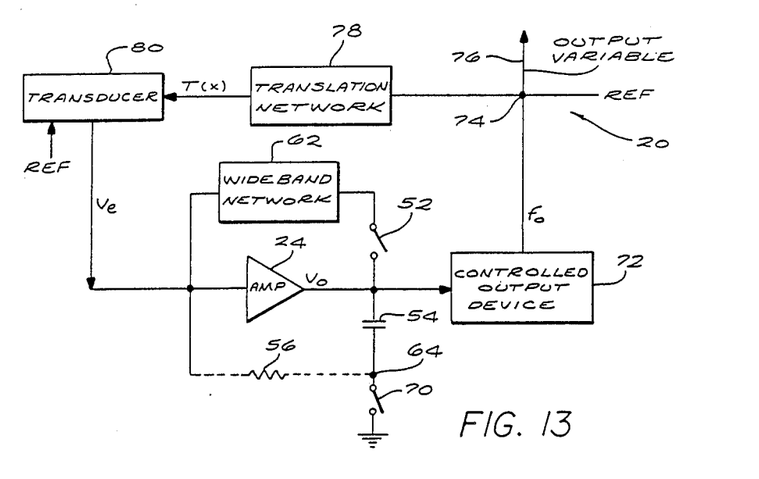
FIG. 13 is a generalized alternative embodiment of the fast switching phase lock loop incorporating the present invention.

A generalized alternative diagram of the fast switching phase lock loop is illustrated in FIG. 13. It is intended that the diagram illustrated in FIG. 13 be applicable to both phase lock loops 20 and generalized servo loops. The amplifier 24 exists with the wide band loop 62 connected in series with the first feedback switch 52, the combination being placed across the amplifier 24. The second feedback loop is represented by the resistor 56 shown in phantom and connected to the feedback capacitor 54. The terminal 64 of the capacitor 54 is connected through a switch 70 to electrical ground. The output of the amplifier 24 is the voltage $v_o$ which is fed to a controlled output device 72. The output of the controlled output device is a signal designated by $f_o$ which combines with the reference signal at a terminal junction 74. The signal $f_o$ from the control output device 72 is fed to an output terminal 76 while the combination of the signal $f_o$ and the reference signal are transmitted to a translation network 78. The output of the translation network 78 is a transfer function designated as $T(x)$ which is fed to a transducer 80. The transducer 80 combines the transfer function $T(x)$ with a second reference signal providing an error signal $v_e$ which is fed back to the amplifier 24. The introduction of the error signal into the amplifier reduces the overall error by operation of negative feedback.

From the foregoing, it will be appreciated that the phase lock loop of the invention achieves a fast settling time while maintaining a narrow final loop bandwidth for electrical noise and spur reduction. Further, when switching from the fast settling state to the slow settling state, the voltage across the feedback capacitor is not reduced to zero which permits the phase lock loop to derive the maximum benefit from the pretune and the precharge circuits. Therefore, the frequency synthesizer may respond more rapidly to a change in the reference voltage permitting the output of the synthesizer to be consistent with the variation in the reference signal.

While a particular form of the invention has been illustrated and described, it will be apparent that various modifications can be made without departing from the spirit and scope of the invention. Accordingly, it is not intended that the invention be limited, except as by the appended claims.

What is claimed is:

1. A servo system frequency synthesizer comprising, in combination:
   an amplifier;
   a feedback network connected in parallel electrical communication with said amplifier for initially providing a wide bandwidth characteristic to the servo system upon the variation of a first reference signal;
   a filter connected in parallel electrical communication with said amplifier for providing a narrow bandwidth characteristic after said feedback network has partially settled the servo system upon said variation of said first reference signal;
   a controlled output device connected to said amplifier for providing a controlled synthesized output signal;
   a transducer connected between said controlled output device and said amplifier for providing an error signal to said amplifier; and
   a controlled switching device connected to said narrow bandwidth filter for removing said filter from the circuit of said amplifier, said filter controlling the settling time of said servo system when said filter is not removed from the circuit of said amplifier, and the settling time of said servo system being controlled by the wide bandwidth characteristic of said feedback network when said filter is removed from the circuit, thereby reducing the settling time of said servo system and for charging a narrow bandwidth feedback capacitor eliminating voltage transients upon operating said controlled switching device.

2. The servo system frequency synthesizer of claim 1 which further comprises a translation network for mixing said synthesized output signal with said first reference signal.

3. The servo system frequency synthesizer of claim 1 which further comprises a translation network for filtering out undesirable portions of a combination comprised of said synthesized output signal and said first reference signal.

4. The servo system frequency synthesizer of claim 1 which further comprises a translation network for dividing by a constant, a combination of said synthesized output signal and said first reference signal.

5. The servo system frequency synthesizer of claim 1 wherein said controlled output device is a voltage-controlled oscillator.

6. The servo system frequency synthesizer of claim 5 wherein said synthesized output signal is a synthesized frequency signal.

7. The servo system frequency synthesizer of claim 6 wherein said synthesized frequency signal is dependent upon a voltage input signal from said amplifier to said voltage-controlled oscillator.

8. The servo system frequency synthesizer of claim 1 wherein said controlled switching device is an electronic switch.

9. The servo system frequency synthesizer of claim 1 wherein said controlled switching device is an optical switch.

10. The servo system frequency synthesizer of claim 1 wherein said controlled switching device is a mechanical relay 11. The servo system frequency synthesizer of claim 1 wherein said controlled switching device is operated by a switch control circuit.

12. The servo system frequency synthesizer of claim 1 wherein said transducer is a phase detector.

13. The servo system frequency synthesizer of claim 1 wherein said error signal is fed back to said amplifier for minimizing the difference between a second reference signal and a combination comprised of said synthesized output signal and said first reference signal.

14. The servo system frequency synthesizer of claim 1 wherein said feedback network comprises a capacitor.

15. The servo system frequency synthesizer of claim 1 wherein said feedback network comprises a resistor.

16. The servo system frequency synthesizer of claim 1 wherein said narrow bandwidth feedback capacitor is connected to electrical ground when said controlled switching device is closed.

17. A phase lock loop for providing a synthesized frequency signal comprising, in combination:
   an amplifier;
   a wideband feedback network connected in parallel electrical communication with the amplifier for initially providing a wide bandwidth characteristic to the phase lock loop upon the variation of a first reference signal;
   a filter connected in parallel electrical communication with the amplifier for providing a narrow bandwidth characteristic after said wideband feedback network has partially settled the phase lock loop upon said variation of said first reference signal;
   a voltage-controlled output device connected to said amplifier for providing a synthesized output signal;
   a mixer device connected to receive said synthesized output signal and said first reference signal, said mixer device providing an output signal comprising the difference of said received signals;
   a phase detector connected to said mixer device for receiving said difference signal, said detector comparing said difference signal with a second reference signal for providing an error signal to said amplifier; and
   a controlled switching device connected to said narrow bandwidth filter for removing said filter from the amplifier circuit, said filter controlling the settling time of said phase lock loop when said filter is not removed from the circuit of said amplifier, and the settling time of said phase lock loop being controlled by the wide bandwidth characteristic of said feedback network when said filter is removed from the circuit, reducing the settling time of the phase lock loop and for charging a narrow bandwidth feedback capacitor eliminating voltage transients upon operation of said controlled switching device.

18. The phase lock loop of claim 17 which further comprises a low pass filter for passing said mixer output signal comprised of said difference between the synthesized output signal and said first reference signal, said low pass filter blocking other combinations of said mixer output signal.

19. The phase lock loop of claim 17 which further comprises a divider circuit for dividing said mixer output signal by a constant.

20. The phase lock loop of claim 17 wherein said voltage-controlled output device is a voltage-controlled oscillator.

21. The phase lock loop of claim 20 wherein said synthesized output signal is a synthesized frequency signal.

22. The phase lock loop of claim 21 wherein said synthesized frequency signal is dependent upon a voltage input signal from said amplifier to said voltage-controlled oscillator.

23. The phase lock loop of claim 17 wherein said controlled switching device is an electronic switch.

24. The phase lock loop of claim 17 wherein said controlled switching device is an optical switch.

25. The phase lock loop of claim 17 wherein said controlled switching device is operated by a switch control circuit.

26. The phase lock loop of claim 17 wherein said wideband feedback network comprises a capacitor in combination with a resistor.

27. The phase lock loop of claim 17 wherein said narrow bandwidth feedback capacitor is connected to electrical ground when said controlled switching device is closed.

28. A phase lock loop for providing a synthesized frequency signal comprising, in combination:
   a loop amplifier;
   a wideband feedback network connected in parallel electrical communication with the loop amplifier for initially providing a wide bandwidth characteristic to the phase lock loop upon the variation of a first reference signal;
   a loop filter connected in parallel electrical communication with the loop amplifier for providing a narrow bandwidth characteristic after said wideband feedback network has partially settled the phase lock loop upon said variation of the first reference signal;
   a voltage-controlled oscillator connected to said loop amplifier for providing a synthesized frequency signal;
   a frequency translation network receiving said synthesized frequency signal for mixing with a first reference signal providing a translation signal, said translation signal being passed through a translation filter;
   a phase detector connected to said frequency translation network for receiving said translation signal, said phase detector comparing said translation signal with a second reference signal for providing an error signal to said amplifier;
   a precharging circuit electrically connected to said loop filter for precharging a narrow bandwidth feedback capacitor to an anticipated level; and
   a transistor switch connected to said narrow bandwidth loop filter for removing said loop filter from the loop amplifier circuit, said filter controlling the settling time of said phase lock loop when said filter is not removed from the circuit of said amplifier, and the settling time of said phase lock loop being controlled by the wide bandwidth characteristic of said feedback network when said filter is removed from the circuit, reducing the settling time of the phase lock loop and for completing the charge on said narrow bandwidth capacitor eliminating voltage transients upon operation of said transistor switch.

29. A phase lock loop for providing a synthesized frequency signal comprising, in combination:
   a loop amplifier;
   a wideband feedback network connected in parallel electrical communication with the loop amplifier for initially providing a wide bandwidth characteristic to the phase lock loop upon the variation of a first reference signal;
   a loop filter connected in parallel electrical communication with the loop amplifier for providing a narrow bandwidth characteristic after said wideband feedback network has partially settled the phase lock loop upon said variation of the first reference signal;
   a voltage-controlled oscillator connected to said loop amplifier for providing a synthesized frequency signal;
   a frequency translation network receiving said synthesized frequency signal for mixing with a first reference signal providing a translation signal, said translation signal being passed through a translation filter and a divider;
   a phase detector connected to said frequency translation network for receiving said translation signal, said phase detector comparing said translation signal with a second reference signal for providing an error signal to said amplifier;
   a pretune circuit electrically connected to said voltage-controlled oscillator for reducing the required change in voltage across a narrow bandwidth feedback capacitor; and
   a transistor switch connected to said narrow bandwidth loop filter for removing said loop filter from the loop amplifier circuit, said filter controlling the settling time of said phase lock loop when said filter is not removed from the circuit of said amplifier and the settling time of said phase lock loop being controlled by the wide bandwidth characteristic of said feedback network when said filter is removed from the circuit, reducing the settling time of the phase lock loop and for completing the charge on said narrow bandwidth feedback capacitor eliminating voltage transients upon operation of said transistor switch.

30. A method for providing a synthesized frequency signal in a phase lock loop, said method comprising the steps of:
   receiving a variation in signal from a first reference source;
   mixing said received signal with said synthesized frequency signal;
   selecting the difference of said mixed signals for delivery to a phase detector;
   comparing said difference of said mixed signals with a signal from a second reference source;
   providing an error signal for minimizing the settling time caused by said signal variation;
   amplifying said error signal for reducing the error in the synthesized signal;
   connecting a wide bandwidth feedback path for providing a fast settling time and for charging a feedback capacitor in a narrow bandwidth feedback path controlling the settling time;

switching to said narrow bandwidth feedback path for completing the charging of said feedback capacitor for enhancing the settling time and for eliminating transitions of voltage upon connecting said narrow bandwidth feedback path; and precharging said feedback capacitor for further enhancing the settling time of the phase lock loop.

31. The method for providing the synthesized frequency signal of claim 30, which further comprises the step of pretuning an oscillating circuit for reducing the required change in feedback capacitor voltage for enhancing the settling time of the phase lock loop.

32. A servo system frequency synthesizer comprising, in combination:

an amplifier;

a feedback network in electrical communication with said amplifier for initially providing a wide bandwidth characteristic to the servo system upon the variation of a first reference signal;

a filter in electrical communication with said amplifier for providing a narrow bandwidth characteristic after said feedback network has partially settled the servo system upon said variation of said first reference signal;

a controlled output device connected to said amplifier for providing a controlled synthesized output signal;

a transducer connected between said controlled output device and said amplifier for providing an error signal to said amplifier; and a controlled switching device connected to said narrow bandwidth filter for removing said filter from the circuit of said amplifier thereby reducing the settling time of said servo system and for charging a narrow bandwidth feedback capacitor eliminating voltage transients upon operating said controlled switching device, said switching device being operated by a switch control circuit which monitors said error signal.

33. A servo system frequency synthesizer comprising, in combination:

an amplifier;

a feedback network in electrical communication with said amplifier for initially providing a wide bandwidth characteristic to the servo system upon the variation of a first reference signal;

a filter in electrical communication with said amplifier for providing a narrow bandwidth characteristic after said feedback network has partially settled the servo system upon said variation of said first reference signal;

a controlled output device connected to said amplifier for providing a controlled synthesized output signal;

a transducer connected between said controlled output device and said amplifier for providing an error signal to said amplifier; and a controlled switching device connected to said narrow bandwidth filter for removing said filter from the circuit of said amplifier thereby reducing the settling time of said servo system and for charging a narrow bandwidth feedback capacitor eliminating voltage transients upon operating said controlled switching device, said switching device being operated by a switch control circuit which monitors the charging time of said narrow bandwidth feedback capacitor.

34. A servo system frequency synthesizer comprising, in combination:

an amplifier;

a feedback network including a feedback switch in electrical communication with said amplifier for disconnecting said feedback network from said amplifier for initially providing a wide bandwidth characteristic to the servo system upon the variation of a first reference signal;

a filter in electrical communication with said amplifier for providing a narrow bandwidth characteristic after said feedback network has partially settled the servo system upon said variation of said first reference signal;

a controlled output device connected to said amplifier for providing a controlled synthesized output signal;

a transducer connected between said controlled output device and said amplifier for providing an error signal to said amplifier; and a controlled switching device connected to said narrow bandwidth filter for removing said filter from the circuit of said amplifier thereby reducing the settling time of said servo system and for charging a narrow bandwidth feedback capacitor eliminating voltage transients upon operating said controlled switching device.

35. A servo system frequency synthesizer comprising, in combination:

an amplifier;

a feedback network in electrical communication with said amplifier for initially providing a wide bandwidth characteristic to the servo system upon the variation of a first reference signal;

a filter in electrical communication with said amplifier for providing a narrow bandwidth characteristic after said feedback network has partially settled the servo system upon said variation of said first reference signal;

a controlled output device connected to said amplifier for providing a controlled synthesized output signal;

a transducer connected between said controlled output device and said amplifier for providing an error signal to said amplifier; and a controlled switching device connected to said narrow bandwidth filter for removing said filter from the circuit of said amplifier thereby reducing the settling time of said servo system and for charging a narrow bandwidth feedback capacitor eliminating voltage transients upon operating said controlled switching device, said narrow bandwidth filter including a resistive element in combination with said narrow bandwidth feedback capacitor, said resistive element being removed from the circuit of said filter when said controlled switching device is closed.

36. A phase lock loop for providing a synthesized frequency signal comprising, in combination:

an amplifier;

a wideband feedback network in electrical communication with the amplifier for initially providing a wide bandwidth characteristic to the phase lock loop upon the variation of a first reference signal;

a filter in electrical communication with the amplifier for providing a narrow bandwidth characteristic after said wideband feedback network has partially settled the phase lock loop upon said variation of said first reference signal;

a voltage-controlled output device connected to said amplifier for providing a synthesized output signal;

a mixer device connected to receive said synthesized output signal and said first reference signal, said mixer device providing an output signal comprising the difference of said received signals;

a phase detector connected to said mixer device for receiving said difference signal, said detector comparing said difference signal with a second reference signal for providing an error to said amplifier; and a controlled switching device connected to said narrow bandwidth filter for removing said filter from the amplifier circuit reducing the settling time of the phase lock loop and for charging a narrow bandwidth feedback capacitor eliminating voltage transients upon operation of said controlled switching device, said switching device being operated by a switch control circuit which monitors said error signal.

37. A phase lock loop for providing a synthesized frequency signal comprising, in combination:

an amplifier;

a wideband feedback network in electrical communication with the amplifier for initially providing a wide bandwidth characteristic to the phase lock loop upon the variation of a first reference signal;

a filter in electrical communication with the amplifier for providing a narrow bandwidth characteristic after said wideband feedback network has partially settled the phase lock loop upon said variation of said first reference signal;

a voltage-controlled output device connected to said amplifier for providing a synthesized output signal;

a mixer device connected to receive said synthesized output signal and said first reference signal, said mixer device providing an output signal comprising the difference of said received signals;

a phase detector connected to said mixer device for receiving said difference signal, said detector comparing said difference signal with a second reference signal for providing an error to said amplifier; and a controlled switching device connected to said narrow bandwidth filter for removing said filter from the amplifier circuit reducing the settling time of the phase lock loop and for charging a narrow bandwidth feedback capacitor eliminating voltage transients upon operation of said controlled switching device, said switching device being operated by a switch control circuit which monitors the charging time of said narrow bandwidth feedback capacitor.

38. A phase lock loop for providing a synthesized frequency signal comprising, in combination:

an amplifier;

a wideband feedback network including a feedback switch in electrical communication with the amplifier for disconnecting said wideband feedback network from said amplifier for initially providing a wide bandwidth characteristic to the phase lock loop upon the variation of a first reference signal;

a filter in electrical communication with the amplifier for providing a narrow bandwidth characteristic after said wideband feedback network has partially settled the phase lock loop upon said variation of said first reference signal;

a voltage-controlled output device connected to said amplifier for providing a synthesized output signal;

a mixer device connected to receive said synthesized output signal and said first reference signal, said mixer device providing an output signal comprising the difference of said received signals;

a phase detector connected to said mixer device for receiving said difference signal, said detector comparing said difference signal with a second reference signal for providing an error to said amplifier; and a controlled switching device connected to said narrow bandwidth filter for removing said filter from the amplifier circuit reducing the settling time of the phase lock loop and for charging a narrow bandwidth feedback capacitor eliminating voltage transients upon operation of said controlled switching device.

* * * * *